United States Patent
Fu et al.

(10) Patent No.: US 9,582,633 B2
(45) Date of Patent: Feb. 28, 2017

(54) 3D DEVICE MODELING FOR FINFET DEVICES

(71) Applicant: Taiwan Semiconductor Manufacturing Company Limited, Hsin-Chu (TW)

(72) Inventors: Chung-min Fu, Chungli (TW); Meng-Fu You, Changhua (TW); Po-Hsiang Huang, Tainan (TW); Wen-Hao Cheng, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/946,051

(22) Filed: Jul. 19, 2013

(65) Prior Publication Data

US 2015/0026657 A1 Jan. 22, 2015

(51) Int. Cl.
*G06F 11/22* (2006.01)
*G06F 17/50* (2006.01)

(52) U.S. Cl.
CPC ...... *G06F 17/5081* (2013.01); *G06F 17/5009* (2013.01); *G06F 17/5068* (2013.01)

(58) Field of Classification Search
USPC ........................................................ 716/136
See application file for complete search history.

(56) References Cited

U.S. PATENT DOCUMENTS

| | | | |
|---|---|---|---|
| 8,263,462 B2 * | 9/2012 | Hung et al. | 438/286 |
| 8,689,157 B1 * | 4/2014 | Lo et al. | 716/111 |
| 2007/0198955 A1 * | 8/2007 | Nagatomo et al. | 716/1 |
| 2008/0283917 A1 * | 11/2008 | Cheng et al. | 257/347 |
| 2010/0163971 A1 * | 7/2010 | Hung | H01L 29/66795 257/327 |
| 2013/0228778 A1 * | 9/2013 | Tsai et al. | 257/48 |

OTHER PUBLICATIONS

Pei, Gen et al. "FinFET Design Consideration Based on 3-D Simulation and Analytical Modeling", Aug. 2002, IEEE Transactions in Electron Devices vol. 49, No. 8, pp. 1411-1419.*

* cited by examiner

*Primary Examiner* — Bryce Aisaka
(74) *Attorney, Agent, or Firm* — Cooper Legal Group, LLC

(57) ABSTRACT

Among other things, techniques and systems for 3D modeling of a FinFET device and for detecting a variation for a design layout based upon a 3D FinFET model are provided. For example, a fin height of a FinFET device is determined based upon imagery of the FinFET device. The fin height and a 2D FinFET model for the FinFET device are used to create a 3D FinFET model. The 3D FinFET model takes into account the fin height, which is evaluated to identify fin height variations amongst FinFET devices within the design layout. For example, a fin height variation is determined based upon a proximity pattern density, a fin pitch, a gate length, or other parameters/measurements. A voltage threshold variation is determined based upon the fin height variation. This allows the design layout to be modified to decrease the variation.

20 Claims, 7 Drawing Sheets

3D DEVICE MODELING FOR FINFET DEVICES

BACKGROUND

A design layout generally models a layout comprising one or more devices, such as one or more transistors. Generally a transistor comprises a source region, a drain region, a channel region between the source region and the drain region, and a gate region above the channel regions. The gate region governs current flow within the channel region based upon a voltage or bias applied to the gate region. Generally, when a bias is applied to the gate region such that current flows in the channel region between the source region and the drain region, the transistor is regarded as being on, and when little to no current is flowing in the channel region between the source region and the drain region, the transistor is regarded as being off.

DETAILED DESCRIPTION

Figure 1A:
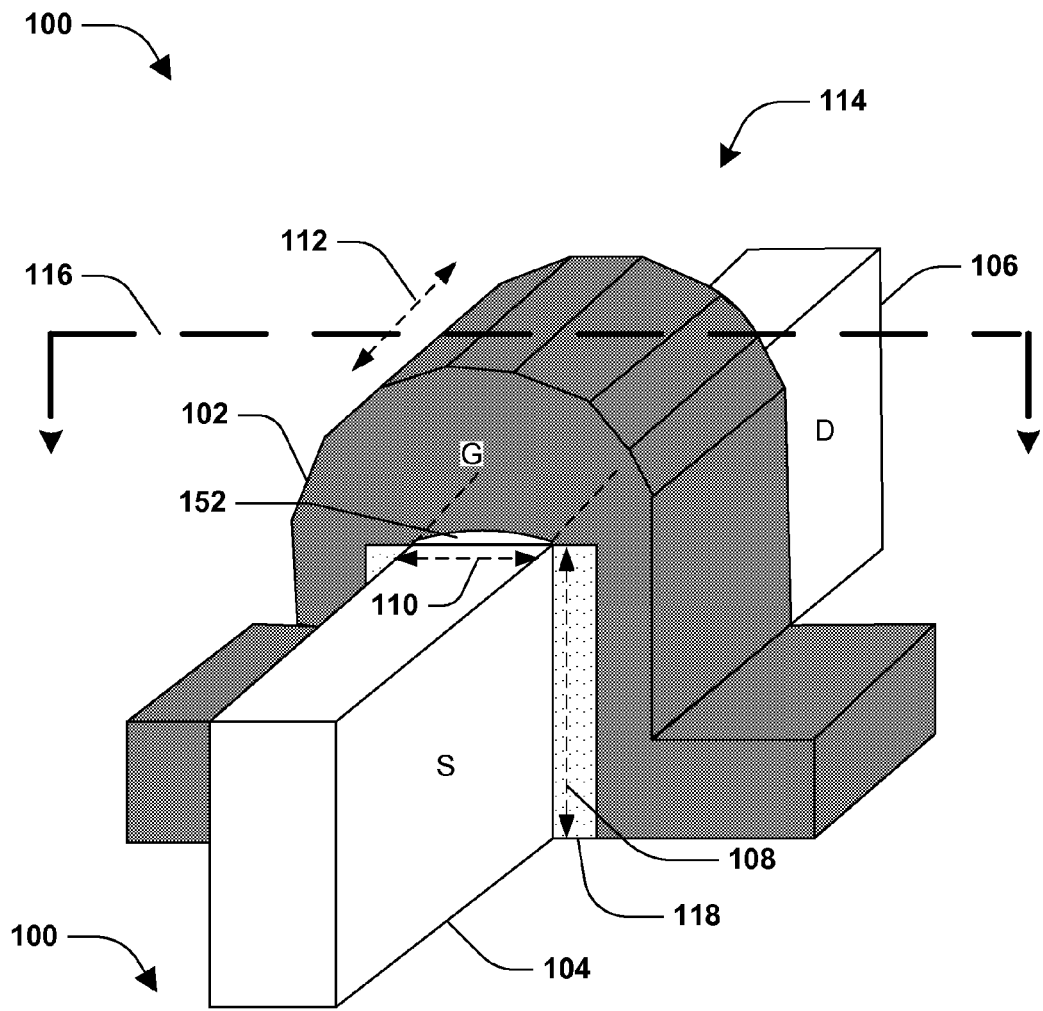
FIG. 1A is an illustration of a FinFET device, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

In an example, operation of a 2D planar transistor is generally controlled by a 2D gate area corresponding to a gate width and a gate length of a gate region. In another example, a 3D transistor, such as a FinFET transistor, comprises a gate region that wraps around one or more surfaces of the channel region, and thus operation of the FinFET transistor is generally controlled by a 3D gate area corresponding to a gate width, a gate length, and a gate height of a gate region. Because electronic device design tools, such as a spice tool, focus on 2D layouts, such electronic device design tools do not account for a gate height of a 3D transistor during design and simulation. Accordingly, as provided herein, 3D modeling is contemplated that takes into consideration gate height as well as gate width and gate length.

Figure 1B:
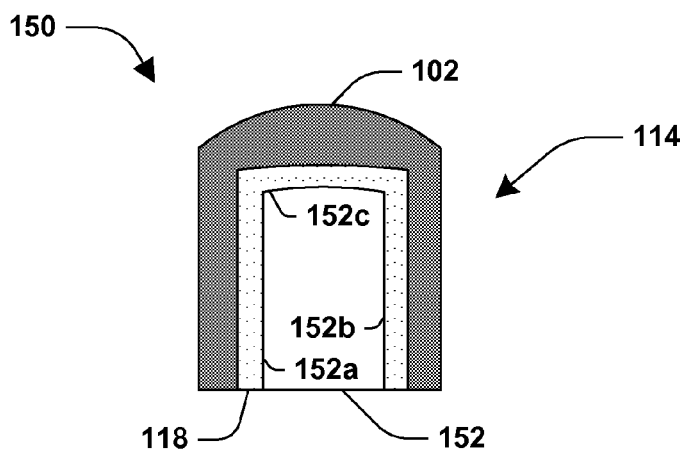
FIG. 1B is an illustration of a FinFET device take along line 116 of FIG. 1A, according to some embodiments.

FIG. 1A illustrates an example 100 of a FinFET device 114, and FIG. 1B illustrates an example 150 of the FinFET device 114 taken along line 116 of FIG. 1A through a gate region (G) 102 and a channel region 152 of the FinFET device 114. The FinFET device 114 comprises a source region (S) 104 and a drain region (D) 106. The channel region 152 is positioned between the source region 104 and the drain region 106. The gate region 102 of the FinFET device 114 wraps around one or more surfaces of the channel region 152, such as a first vertical surface 152a, a second vertical surface 152b, and a top surface 152c, as illustrated in FIG. 1B. In an example, a dielectric layer 118 is positioned between the gate region 102 and the channel region 152. In an example, the source region 104, the channel region 152, and the drain region 106 are comprised within a fin of the FinFET device 114, where the FinFET device 114 comprises one or more fins. The gate region 102 electrically controls the FinFET device 114 by controlling the channel region 152. For example, responsive to a voltage being applied to the gate region 102 or a lack of a voltage, the gate region 102 modifies properties of the channel region 152 so that current flows through the channel region 152 between the source region 104 and the drain region 106, resulting in the FinFET device 114 being in an ON state. Control over the channel region 152 is based upon a fin width 110, a fin length 112, and a fin height 108 (e.g., twice the fin height 108 due to the gate region 102 wrapping around the first vertical surface 152a and the second vertical surface 152b). Increasing the fin height 108 improves electrical characteristics, such as speed or responsiveness, of the FinFET device 114. In an example, a semiconductor wafer or portion thereof comprises multiple FinFET devices. Variations in fin heights among different fins or among different Fin FET devices, or both, results in variations in voltage thresholds and mismatched electrical indexes. Accordingly, as provided herein, the FinFET device 114 is modeled as a 3D device to take into account fin height so that fin height variations are detected. In this way, a design layout of the FinFET device is modified to decrease such variations.

Figure 2:
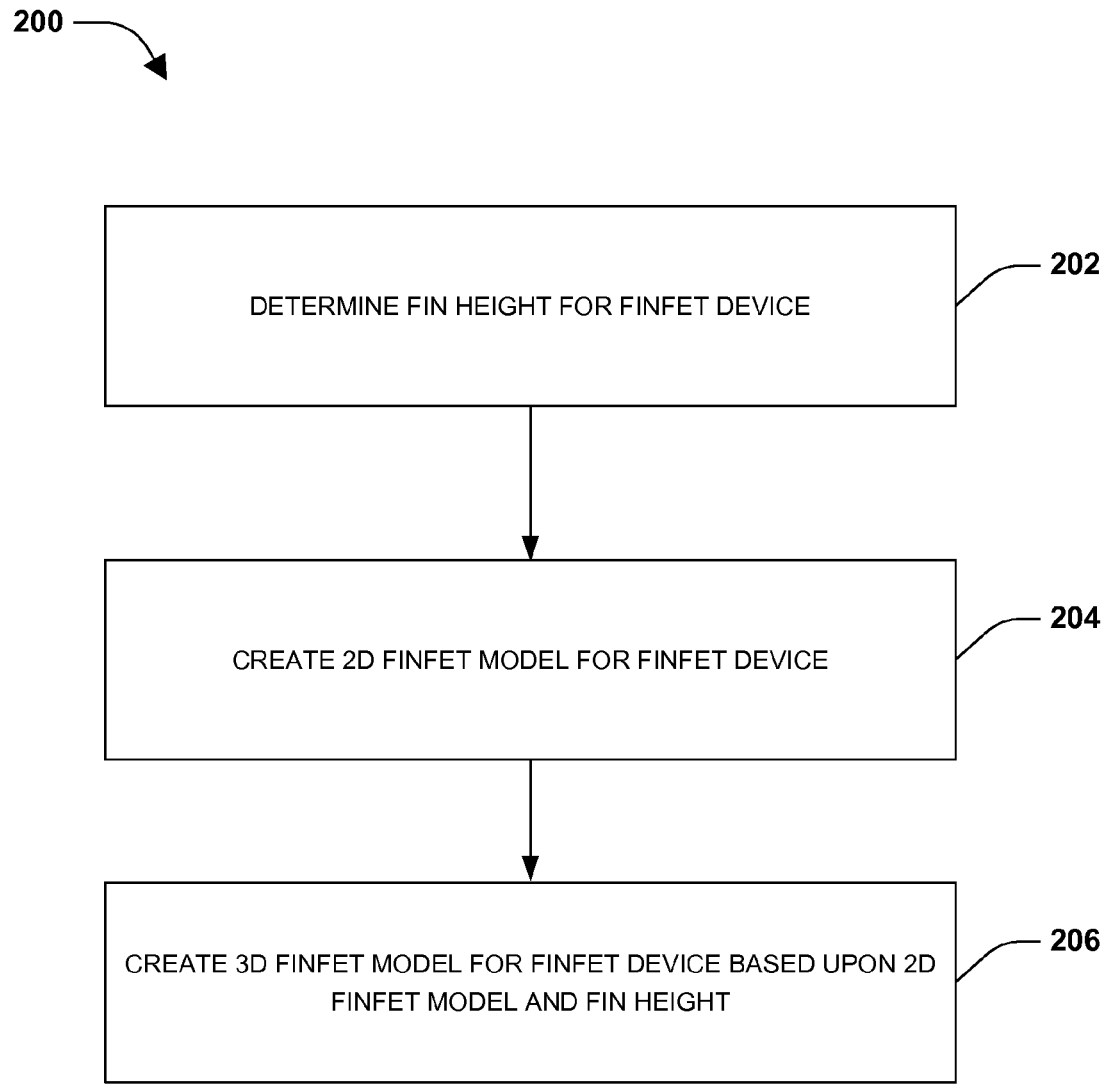
FIG. 2 is a flow diagram illustrating a method of 3D modeling of a FinFET device, according to some embodiments.

A method 200 of 3D modeling of a FinFET device is illustrated in FIG. 2. A design layout of an integrated circuit comprises one or more devices, such as one or more FinFET devices. The design layout is designed, simulated, and analyzed, such as to determine electrical properties of devices or to determine that the design layout satisfies various design constraints such as spacing constraints or sizing constraints. During fabrication of the integrated circuit, imagery of the one or more devices is obtained. For example, high resolution imagery of a FinFET device is obtained in-line by a scanning electron microscope or a transmission electron microscope. The imagery is evaluated to determine various characteristics of the FinFET device, such as a fin height. Accordingly, the fin height for the FinFET device, represented within the design layout, is determined based upon the imagery of the FinFET device, at 202. In an example, a 3D fin geometry model of the FinFET device is generated based upon the imagery. A fin height is determined from the 3D fin geometry model. In an example, a first view, a second view, or other views of the FinFET device is generated from the imagery. For example, the first view depicts the FinFET device from a first viewing angle, such as a top-down view. The second view depicts the FinFET device from a second viewing angle, such as an oblique view. The first view, the second view, or other views are correlated together to determine the fin height. For example, defined monitoring patterns, such as off-device scribe lines, within-device patterns, or other reference features, are used to correlate the views. It is appreciated that one or more fin heights, such as a first fin height of a first vertical surface of a fin and a second fin height of a second vertical surface of the fin, is identified, and that merely a fin height is described for simplicity.

At 204, a 2D FinFET model for the FinFET device is created. For example, a 2D spice model, comprising the 2D FinFET model, is created from the design layout. The 2D FinFET model corresponds to a fin width and a fin length of the FinFET device. For example, a layout verse schematic (LVS) technique or a layout parameter extraction (LPE) technique is performed to create a transistor level 2D spice model for the design layout, where the transistor level 2D spice model comprises the 2D FinFET model. At 206, a 3D FinFET model is created based upon the 2D FinFET model and the fin height determined at 202. For example, a 3D spice model, comprising the 3D FinFET model, is created from the design layout. In an example, the fin height is back-annotated into the 2D FinFET model or is used to replace a nominal fin height value with the fin height determined in-line from the imagery of the FinFET device. In this way, the 3D FinFET model takes into account the in-line fin height that is used to determine variations in fin height, voltage thresholds, or other variations between devices or parameters within the design layout. It is appreciated that one or more 3D FinFET models are created for detection of variations between FinFET devices of the design layout, and that merely a 3D FinFET model is described for simplicity.

In an example, the 3D FinFET model alone or in combination with other 3D FinFET models of the design layout are evaluated to determine a proximity pattern density. The proximity pattern density corresponds to a pattern density (e.g., an amount of material, devices, portions of devices, etc.) within a proximity (e.g., a 10 by 10 micron area) of the design layout. For example, a layout parameter extraction (LPE) technique is performed upon the 3D spice model, comprising the 3D FinFET model or other 3D FinFET models for other FinFET devices within the design layout, to determine the proximity pattern density because the proximity pattern density corresponds to one or more FinFET devices. A fin height variation for the FinFET device (e.g., between a first vertical surface of a fin and a second vertical surface of the fin) or between the FinFET device and other FinFET devices within the design layout is determined based upon the proximity pattern density, a fin pitch, gate length, or other parameters. For example, the fin height variation indicates a variation or mismatch in fin heights of FinFET devices within the design layout or a variation or mismatch in fin heights of fins of a particular FinFET device. A voltage threshold variation or a model mismatch is determined based upon the fin height variation. For example, a fin height corresponds to a voltage threshold (e.g., a taller fin results in an improved voltage threshold), and thus a variation in fin heights between FinFET devices results in different voltage thresholds for the FinFET devices. In another example, RC extraction is performed upon the 3D FinFET model to create a 3DRC FinFET model. For example, the RC extraction is performed upon the 3D spice model to create a 3DRC spice model. The voltage threshold variation is determined based upon the 3DRC FinFET model. It is appreciated that the 3D FinFET model allows various types of variations, such as a fin height variation or a voltage threshold variation, to be identified based upon proximity pattern density, gate width, gate length, spacing, fin height, or other parameters/measurements for the design layout. In an example, a design parameter, such as a size parameter or a spacing parameter, for the design layout is modified based upon the variation. For example, a value for the design parameter is determined based upon the value decreasing the variation. In another example, a value is selected for a design parameter based upon the value increasing the fin height for improved electrical characteristics for the FinFET device such as a speed characteristic.

Figure 3:
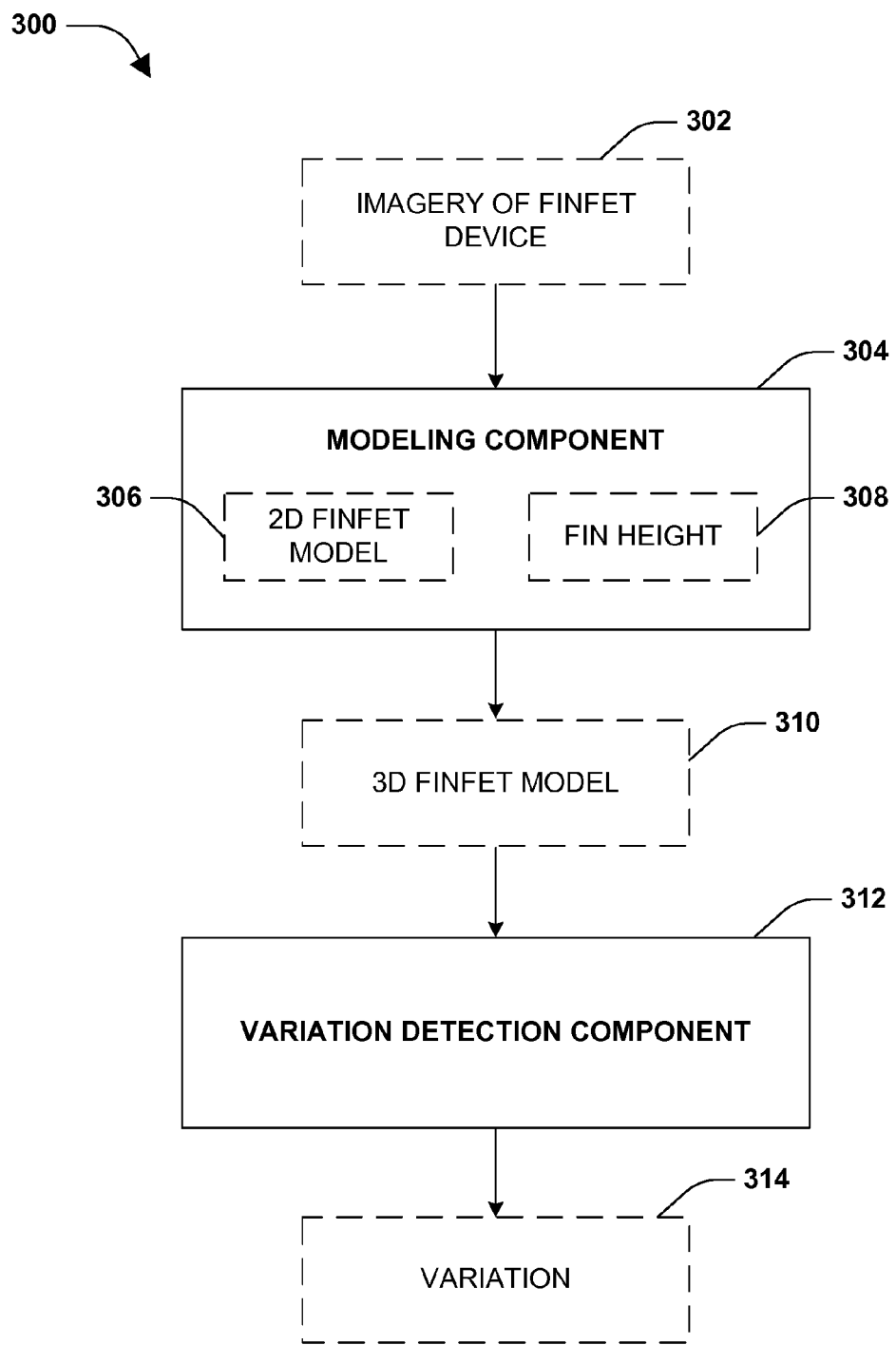
FIG. 3 is an illustration of a system configured for detecting a variation for a design layout based upon a 3D FinFET model, according to some embodiments.

FIG. 3 illustrates an example of a system 300 for detecting a variation 314 for a design layout based upon a 3D FinFET model 310. The system 300 comprises a modeling component 304 and a variation detection component 312. The modeling component 304 is configured to determine a fin height 308 for a FinFET device, represented within a design layout, based upon imagery 302 of the FinFET device. For example, the fin height 308 corresponds to in-line measurement information derived from the imagery 302. The modeling component 304 is configured to create a 2D FinFET model 306, such as a 2D spice model for an integrated circuit comprising the FinFET device, from the design layout. The 2D FinFET model 306 takes into account a fin width and a fin length. Because the 2D FinFET model 306 does not take into account the fin height 308, the modeling component 304 is configured to create a 3D FinFET model 310, such as a 3D spice model for the integrated circuit, based upon the 2D FinFET model 306 and the fin height 308. For example, the modeling component 304 inserts back-annotations into the 2D spice model to create the 3D spice model comprising the 3D FinFET model 310. For example, the fin height 308 is used to supplement a nominal fin height value.

The variation detection component 312 is configured to evaluate the 3D FinFET model 310 to determine a proximity pattern density. For example, the variation detection component 312 evaluates the 3D spice model to determine the proximity pattern density. The variation detection component 312 is configured to determine a variation 314 for the design layout based upon the proximity pattern density, a gate width, a gate length, spacing, the fin height, or other parameters/measurements for the design layout. The variation 314 corresponds to a fin height variation in fin heights amongst FinFET devices within the design layout, a fin height variation in fin heights among a particular FinFET device within the design layout, a variation in voltage thresholds derived from the fin height variation, a mismatch in electric indexes, etc.

Figure 4:
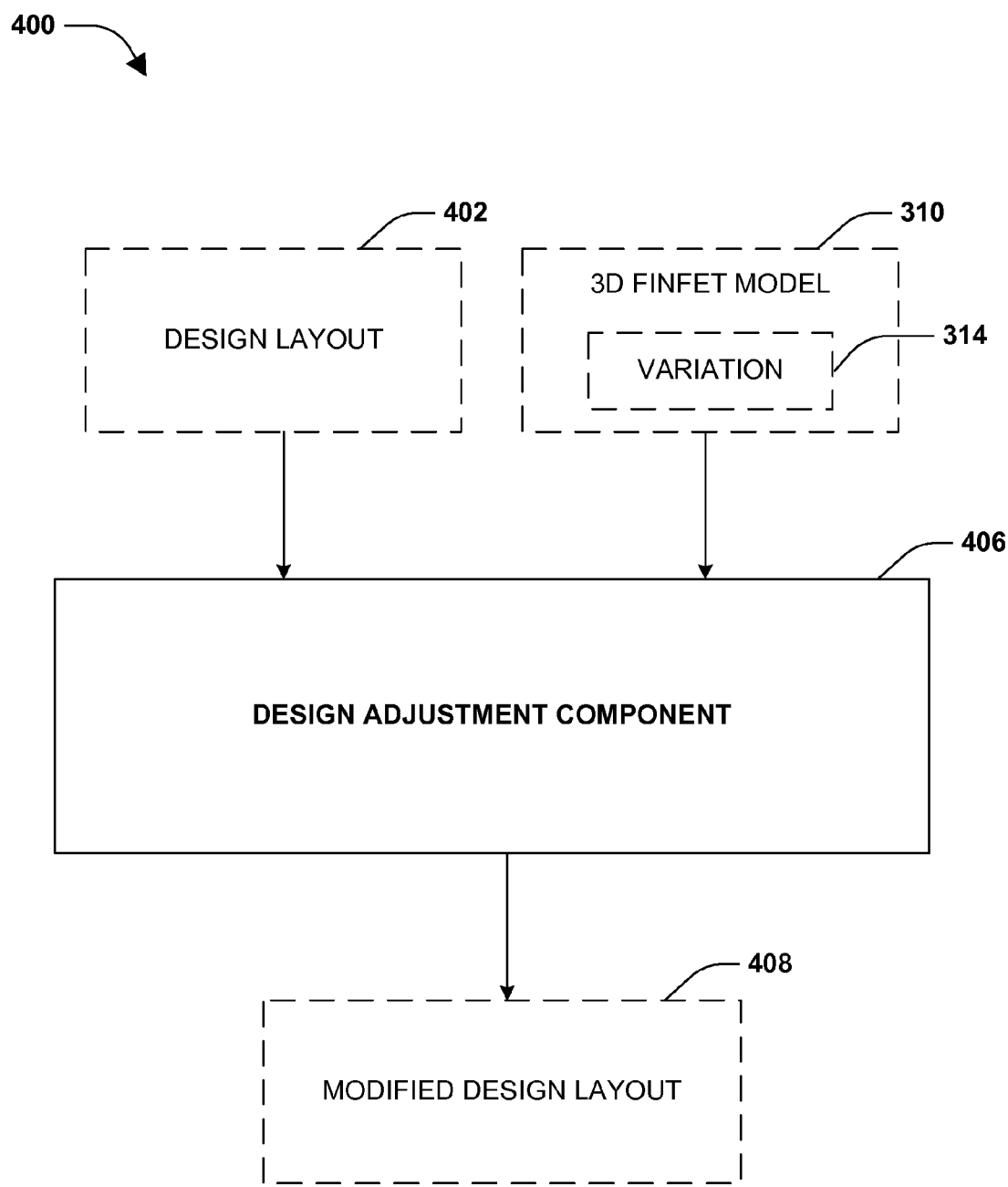
FIG. 4 is an illustration of a system configured for modifying a design layout based upon a 3D FinFET model, according to some embodiments.

FIG. 4 illustrates an example of a system 400 for modifying a design layout 402 based upon a 3D FinFET model 310. The system 400 comprises a design adjustment component 406. In an example, a modeling component, such as the modeling component 304 of FIG. 3, created a 3D FinFET model for a FinFET device within the design layout 402 based upon a fin height. A variation detection component, such as the variation detection component 312 of FIG. 3, identified a variation 314 for the design layout 402 based upon the 3D FinFET model 310. The variation 314 corresponds to a fin height variation, a voltage threshold variation, or other variation amongst one or more FinFET devices within the design layout 402. The design adjustment component 406 is configured to adjust one or more design parameters, such as a width parameter, a height parameter, a length parameter, a spacing parameter, or other parameters, for the design layout 402 to create a modified design layout 408. In an example, the design adjustment component 406 assigns a value to a parameter based upon the value decreasing the variation 314. In another example, the design adjustment component 406 assigns a value to a parameter based upon the value increasing the fin height, where increasing the fin height improves electrical characteristics of the FinFET device, such as a speed of the FinFET device.

Figure 5A:
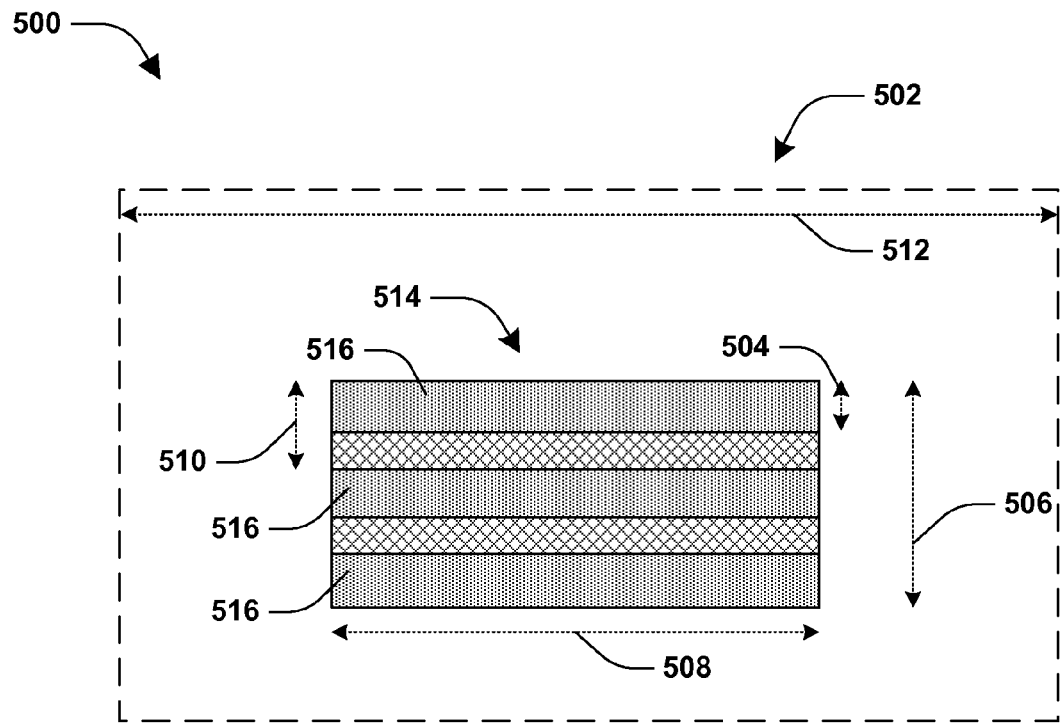
FIG. 5A is an illustration of a proximity density pattern associated with two dimensions of FinFET devices, according to some embodiments.

FIG. 5A illustrates an example 500 of a proximity density pattern associated with two dimensions of one or more FinFET devices 514. The FinFET devices 514 comprise one or more fins 516 corresponding to at least one of source regions, drain regions, or channel regions of the FinFET devices 514. The FinFET devices 514 comprise one or more gates correspond to gate regions 102 of the FinFET devices 514. A fin has a fin width 504 and an associated fin pitch measurement 510 measured from a first edge of a first fin to a first edge of a second fin, or from the middle of the first fin to the middle of the second fin, etc. The FinFET devices 514 comprise an OD region, corresponding to active regions of the devices 514. The OD region has an OD width 506 and an OD length 508. A grid 512, having a grid size 512, is defined for the FinFET devices 514. The FinFET devices 514 within the grid 512 are evaluated to determine the proximity density pattern for the FinFET devices 514. For example, the proximity density pattern corresponds to an amount of material, devices, or portion of devices within the grid 512.

Figure 5B:
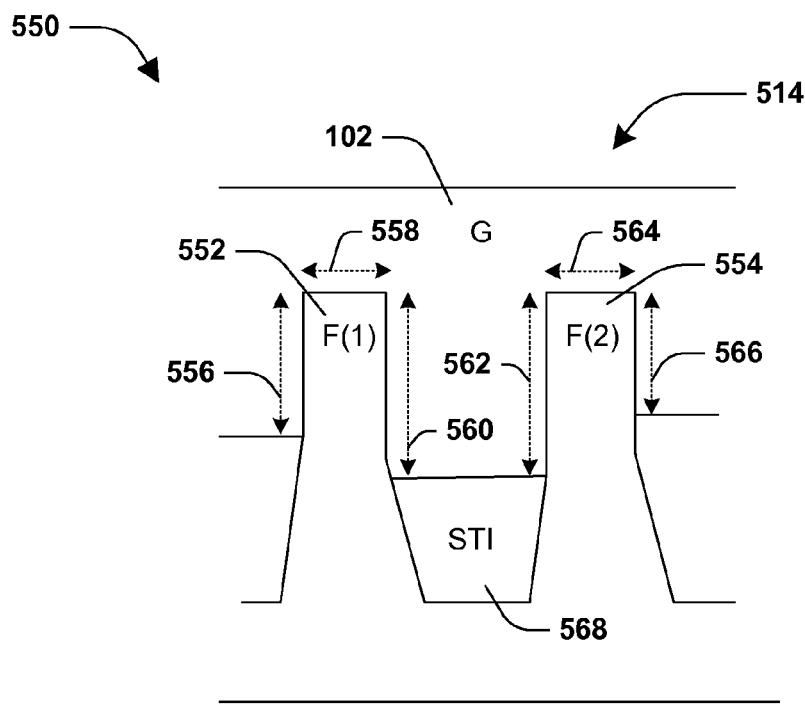
FIG. 5B is an illustration of z-direction variations associated with FinFET devices, according to some embodiments.

FIG. 5B illustrates an example 550 of z-direction variations associated with FinFET devices 514. It is appreciated that in one example, the FinFET devices 514 correspond to the FinFET devices 514 illustrated in example 500 of FIG. 5A. The FinFET devices 514 comprise a first fin 552, a second fin 554, and potentially other fins not illustrated. A shallow trench isolation material (STI) 568 is formed between the first fin 552 and the second fin 554. A gate region 102 is formed over at least some of the first fin 552 and over at least some of the second fin 554. The first fin 552 has a first fin height 556 along a first vertical fin surface of the first fin 552, a second fin height 560 along a second vertical fin surface of the first fin 552, and a first fin width 558. The second fin 554 has a third fin height 562 along a first vertical fin surface of the second fin 554, a fourth fin height 566 along a second vertical fin surface of the second fin 554, and a second fin width 564. In an example, a z-direction variation, such as a fin height variation, corresponds to a difference in height values between one or more of the first fin height 552, the second fin height 560, the third fin height 562, or the fourth fin height 566.

According to an aspect of the instant disclosure, a method for 3D modeling of a FinFET device is provided. The method comprises determining a fin height for a FinFET device represented within a design layout based upon imagery of the FinFET device. A 2D FinFET model for the FinFET device is created. The 2D FinFET model corresponds to a fin width and a fin length. A 3D FinFET model is created for the FinFET device based upon the 2D FinFET model and the fin height.

According to an aspect of the instant disclosure, a system for detecting a variation in a design layout based upon a 3D FinFET model is provided. The system comprises a modeling component configured to determine a fin height for a FinFET device represented within the design layout based upon imagery of the FinFET device. The modeling component is configured to create a 3D FinFET model for the FinFET device based upon the fin height and a 2D FinFET model for the FinFET device. The system comprise a variation detection component configured to evaluate the 3D FinFET model to determine a proximity pattern density. The variation detection component is configured to determine a variation for the design layout based upon the proximity pattern density.

According to an aspect of the instant disclosure, a computer readable medium comprising instructions for performing a method for detecting a variation for a design layout based upon a 3D FinFET model is provided. The method comprises determining a fin height of a FinFET device represented in a design layout based upon imagery of the FinFET device. A 3D FinFET model for the FinFET device is created based upon the fin height and a 2D FinFET model for the FinFET device. The 3D FinFET model is evaluated to determine a variation for the design layout.

Figure 6:
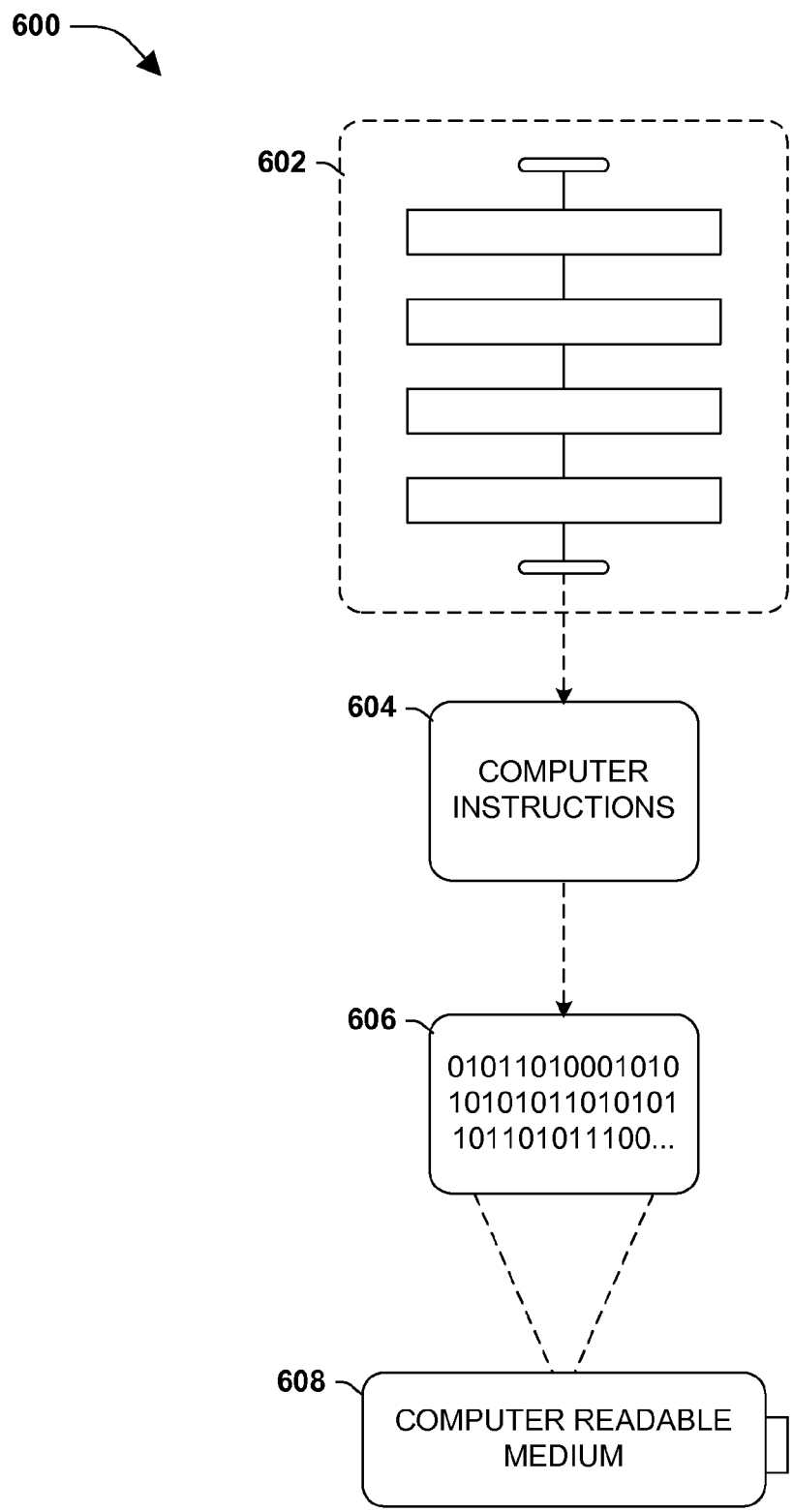
FIG. 6 is an illustration of an example computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An example embodiment of a computer-readable medium or a computer-readable device is illustrated in FIG. 6, wherein the implementation 600 comprises a computer-readable medium 608, such as a CD-R, DVD-R, flash drive, a platter of a hard disk drive, etc., on which is encoded computer-readable data 606. This computer-readable data 606, such as binary data comprising at least one of a zero or a one, in turn comprises a set of computer instructions 604 configured to operate according to one or more of the principles set forth herein. In some embodiments, the processor-executable computer instructions 604 are configured to perform a method 602, such as at least some of the exemplary method 200 of FIG. 2, for example. In some embodiments, the processor-executable instructions 604 are configured to implement a system, such as at least some of the exemplary system 300 of FIG. 3 and/or at least some of the exemplary system 400 of FIG. 4, for example. Many such computer-readable media are devised by those of ordinary skill in the art that are configured to operate in accordance with the techniques presented herein.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing at least some of the claims.

As used in this application, the terms "component", "module," "system", "interface", and the like are generally intended to refer to a computer-related entity, either hardware, a combination of hardware and software, software, or software in execution. For example, a component may include a process running on a processor, a processor, an object, an executable, a thread of execution, a program, or a computer. By way of illustration, both an application running on a controller and the controller can be a component. One or more components may reside within a process or thread of execution and a component may be localized on one computer or distributed between two or more computers.

Furthermore, the claimed subject matter may be implemented as a method, apparatus, or article of manufacture using standard programming or engineering techniques to produce software, firmware, hardware, or any combination thereof to control a computer to implement the disclosed subject matter. The term "article of manufacture" as used herein is intended to comprise a computer program accessible from any computer-readable device, carrier, or media. Of course, many modifications may be made to this configuration without departing from the scope or spirit of the claimed subject matter.

Figure 7:
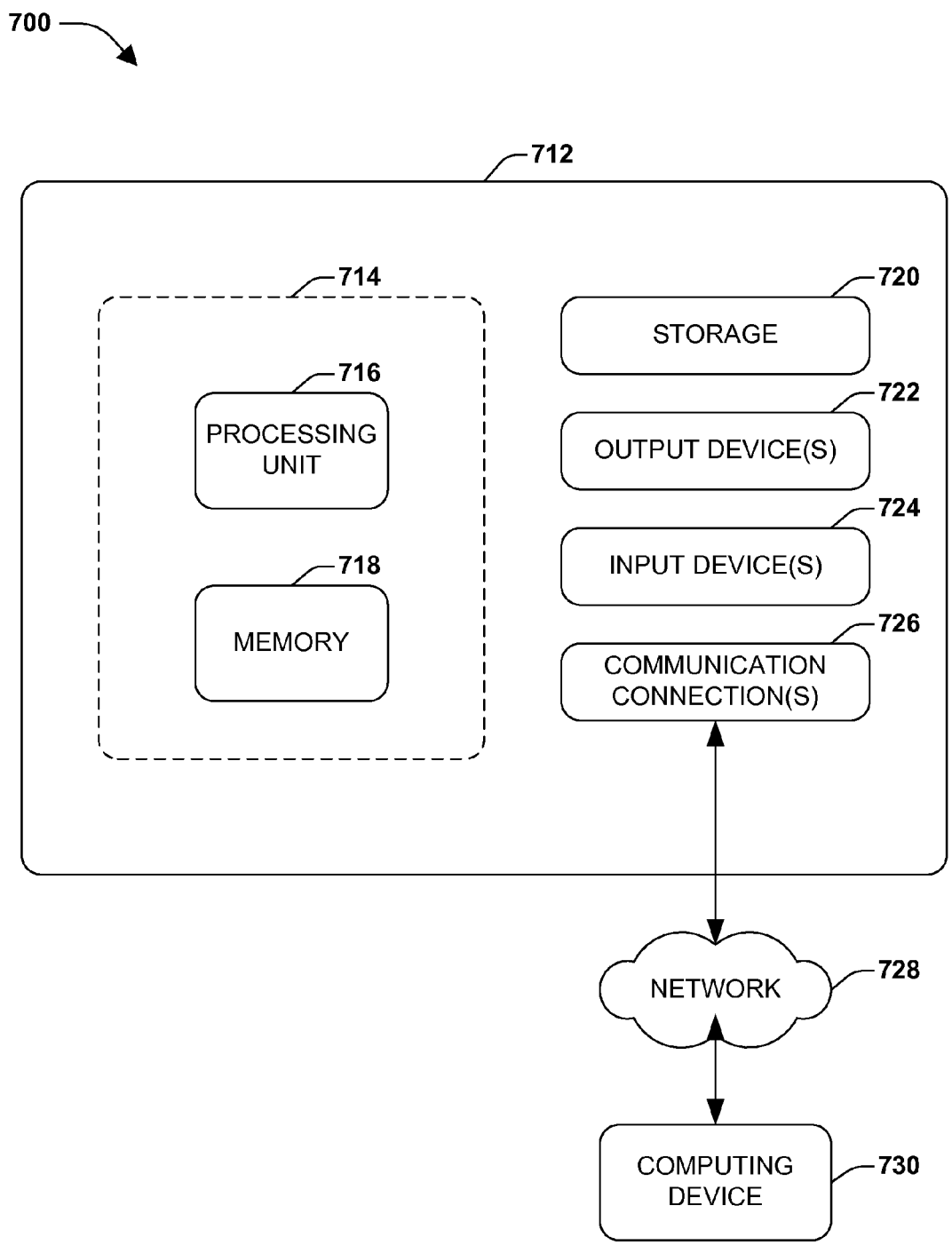
FIG. 7 illustrates an example computing environment wherein one or more of the provisions set forth herein may be implemented.

FIG. 7 and the following discussion provide a brief, general description of a suitable computing environment to implement embodiments of one or more of the provisions set forth herein. The operating environment of FIG. 7 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 7 illustrates an example of a system 700 comprising a computing device 712 configured to implement one or more embodiments provided herein. In one configuration, computing device 712 includes at least one processing unit 716 and memory 718. In some embodiments, depending on the exact configuration and type of computing device, memory 718 is volatile, such as RAM, non-volatile, such as ROM, flash memory, etc., or some combination of the two. This configuration is illustrated in FIG. 7 by dashed line 714.

In other embodiments, device 712 includes additional features or functionality. For example, device 712 also includes additional storage such as removable storage or non-removable storage, including, but not limited to, magnetic storage, optical storage, and the like. Such additional storage is illustrated in FIG. 7 by storage 720. In some embodiments, computer readable instructions to implement one or more embodiments provided herein are in storage 720. Storage 720 also stores other computer readable instructions to implement an operating system, an application program, and the like. Computer readable instructions are loaded in memory 718 for execution by processing unit 716, for example.

The term "computer readable media" as used herein includes computer storage media. Computer storage media includes volatile and nonvolatile, removable and non-removable media implemented in any method or technology for storage of information such as computer readable instructions or other data. Memory 718 and storage 720 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 712. Any such computer storage media is part of device 712.

Device 712 includes communication connection(s) 726, in some embodiments, that allows device 712 to communicate with other devices. Communication connection(s) 726 includes, but is not limited to, a modem, a Network Interface Card (NIC), an integrated network interface, a radio frequency transmitter/receiver, an infrared port, a USB connection, or other interfaces for connecting computing device 712 to other computing devices. Communication connection (s) 726 includes a wired connection or a wireless connection in some embodiments. Communication connection(s) 726 transmits and/or receives communication media in some embodiments.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 712 includes input device(s) 724 such as keyboard, mouse, pen, voice input device, touch input device, infrared cameras, video input devices, or any other input device. Output device(s) 722 such as one or more displays, speakers, printers, or any other output device are also included in device 712. Input device(s) 724 and output device(s) 722 are connected to device 712 via a wired connection, wireless connection, or any combination thereof. In some embodiments, an input device or an output device from another computing device are used as input device(s) 724 or output device(s) 722 for computing device 712. Device 712 also includes communication connection(s) 726 to facilitate communications with one or more other devices.

Components of computing device 912 are connected by various interconnects, such as a bus. Such interconnects include a Peripheral Component Interconnect (PCI), such as PCI Express, a Universal Serial Bus (USB), firewire (IEEE 13104), an optical bus structure, and the like. In another embodiment, components of computing device 912 are interconnected by a network. For example, memory 918 is comprised of multiple physical memory units located in different physical locations interconnected by a network.

Storage devices utilized to store computer readable instructions are distributed across a network in some embodiments. For example, a computing device 930 accessible via a network 928 stores computer readable instructions to implement one or more embodiments provided herein. Computing device 912 accesses computing device 930 and downloads a part or all of the computer readable instructions for execution. Alternatively, computing device 912 downloads pieces of the computer readable instructions, as needed, or some instructions are executed at computing device 912 and some at computing device 930.

Various operations of embodiments are provided herein. The order in which some or all of the operations are described should not be construed as to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
   capturing imagery of a FinFET device during fabrication of the FinFET device;
   determining a fin height for the FinFET device represented within a design layout based upon the imagery of the FinFET device captured during the fabrication of the FinFET device, wherein the fin height is measured from a top surface of a shallow trench isolation (STI) region adjacent a fin of the FinFET device to a top surface of the fin;
   creating a 2D FinFET model for the FinFET device, the 2D FinFET model corresponding to a fin width and a fin length;
   creating a 3D FinFET model for the FinFET device based upon the 2D FinFET model and the fin height; and
   adjusting a parameter based upon the 3D FinFET model to change the fin height of the FinFET device.

2. The method of claim 1, the determining a fin height comprising:
   generating a 3D fin geometry model of the FinFET device based upon the imagery; and
   determining the fin height from the 3D fin geometry model.

3. The method of claim 1, the determining a fin height comprising:
   generating a first view of the FinFET device from the imagery, the first view depicting the FinFET device from a first viewing angle;
   generating a second view of the FinFET device from the imagery, the second view depicting the FinFET device from a second viewing angle different than the first viewing angle; and
   correlating the first view and the second view to determine the fin height.

4. The method of claim 3, the generating a first view comprising generating a top-down view of the FinFET device as the first view, and the generating a second view comprising generating an oblique view of the FinFET device as the second view.

5. The method of claim 3, the correlating comprising:
   correlating defined monitoring patterns corresponding to at least one of off-device scribe lines or within-device patterns.

6. The method of claim 1, comprising:
   evaluating the 3D FinFET model to determine a proximity pattern density.

7. The method of claim 6, comprising:
   determining a fin height variation based upon the proximity pattern density.

8. The method of claim 1, comprising:
   determining a voltage threshold variation based upon a fin height variation derived from the 3D FinFET model.

9. The method of claim 8, the determining a voltage threshold variation comprising:
   performing RC extraction upon the 3D FinFET model to create a 3DRC FinFET model; and
   determining the voltage threshold variation based upon the 3DRC FinFET model.

10. The method of claim 7, the adjusting comprising:
    adjusting the parameter based upon the fin height variation.

11. The method of claim 8, the adjusting comprising:
    adjusting the parameter based upon the voltage threshold variation.

12. A system, comprising:
    a processing unit; and
    memory comprising instructions that when executed by the processing unit perform operations, the operating comprising:
       capturing imagery of a FinFET device during fabrication of the FinFET device;
       determining a fin height for the FinFET device represented within a design layout based upon the imagery of the FinFET device captured during the fabrication of the FinFET device, wherein the fin height is measured from a top surface of a shallow trench isolation (STI) region adjacent a fin of the FinFET device to a top surface of the fin;
       creating a 3D FinFET model for the FinFET device based upon the fin height and a 2D FinFET model for the FinFET device; and adjusting a parameter based upon the 3D FinFET model to change the fin height of the FinFET device.

13. The system of claim 12, the imagery depicting the FinFET device from a first view and a second view and the operations comprising correlating the first view and the second view to determine the fin height.

14. The system of claim 13, the correlating comprising:
correlating defined monitoring patterns corresponding to at least one of off-device scribe lines or within-device patterns.

15. The system of claim 12, the determining comprising:
generating a first view of the FinFET device from the imagery, the first view depicting the FinFET device from a first viewing angle;
generating a second view of the FinFET device from the imagery, the second view depicting the FinFET device from a second viewing angle different than the first viewing angle; and
correlating the first view and the second view to determine the fin height.

16. The system of claim 12, the operations comprising:
determining a voltage threshold variation based upon a fin height variation derived from the 3D FinFET model.

17. The system of claim 12, the operations comprising:
performing RC extraction upon the 3D FinFET model to create a 3DRC FinFET model; and
determining a voltage threshold variation based upon the 3DRC FinFET model.

18. A computer readable storage device comprising instructions that when executed perform a method, the method comprising:
capturing imagery of a FinFET device during fabrication of the FinFET device;
determining a fin height for the FinFET device represented within a design layout based upon the imagery of the FinFET device, wherein the fin height is measured from a top surface of a shallow trench isolation (STI) region adjacent a fin of the FinFET device to a top surface of the fin;
creating a 3D FinFET model for the FinFET device based upon the fin height and a 2D FinFET model for the FinFET device; and
adjusting a parameter based upon the 3D FinFET model to change the fin height of the FinFET device.

19. The computer readable storage device of claim 18, the method comprising:
evaluating the 3D FinFET model to determine a proximity pattern density, the adjusting comprising adjusting the parameter based upon the proximity pattern density.

20. The computer readable storage device of claim 18, the method comprising:
performing RC extraction upon the 3D FinFET model to create a 3DRC FinFET model; and
determining a voltage threshold variation based upon the 3DRC FinFET model, the adjusting comprising adjusting the parameter based upon the voltage threshold variation.

* * * * *